(12) United States Patent
Yu et al.

(10) Patent No.: US 12,057,680 B2
(45) Date of Patent: Aug. 6, 2024

(54) VCSEL-BASED FREE SPACE ACTIVE OPTICAL TRANSCEIVER COMPONENT

(71) Applicant: II-VI Delaware, Inc., Wilmington, DE (US)

(72) Inventors: Guanglong Yu, Fujian (CN); Ce Ren, Fujian (CN); Xu Jia, Fujian (CN); Zihang Wang, Fujian (CN)

(73) Assignee: II-VI DELAWARE, INC., Wilmington, DE (US)

( * ) Notice: Subject to any disclaimer, the term of this patent is extended or adjusted under 35 U.S.C. 154(b) by 613 days.

(21) Appl. No.: 17/309,779

(22) PCT Filed: Dec. 29, 2018

(86) PCT No.: PCT/CN2018/125806
§ 371 (c)(1),
(2) Date: Jun. 17, 2021

(87) PCT Pub. No.: WO2020/124683
PCT Pub. Date: Jun. 25, 2020

(65) Prior Publication Data
US 2022/0052511 A1     Feb. 17, 2022

(30) Foreign Application Priority Data

Dec. 20, 2018   (CN) .......................... 201811577603.2

(51) Int. Cl.
*H01S 5/42*       (2006.01)
*H01S 5/026*      (2006.01)

(52) U.S. Cl.
CPC ............ *H01S 5/423* (2013.01); *H01S 5/0262* (2013.01); *H01S 5/0267* (2013.01)

(58) Field of Classification Search
CPC ............................. H01S 5/0262; H01S 5/0267
See application file for complete search history.

(56) References Cited

U.S. PATENT DOCUMENTS

| 6,563,976 | B1 | 5/2003 | Grann et al. | |
| 2015/0229912 | A1* | 8/2015 | Masalkar | H04N 13/254 348/46 |

(Continued)

FOREIGN PATENT DOCUMENTS

| CN | 101873169 A | 10/2010 |
| CN | 104022433 A | 9/2014 |

(Continued)

OTHER PUBLICATIONS

International Search Report and Written Opinion in PCT Appl. PCT/CN2018/125806, dated Aug. 27, 2019.

*Primary Examiner* — Tuan N Nguyen
(74) *Attorney, Agent, or Firm* — Blank Rome LLP

(57) ABSTRACT

A vertical cavity surface emitting laser (VCSEL)-based free space active optical transceiver component includes a transmitter and a receiver. The transmitter includes first VCSELs, at least one first photodiode, a first focusing lens array or optical system (14), and a first printed circuit board. The receiver includes second photodiodes, at least one second VCSEL, a second focusing lens array or optical system, and a second printed circuit board. The transmission and reception of a short/medium-distance free space (wireless) high-speed optical communication signal can be implemented, and a single-channel transceiving rate may reach 10 Gbps or higher. The component may be used for implementing a free space high-speed signal transmission function in a short/medium-range high-definition multimedia interface (HDMI) device.

15 Claims, 5 Drawing Sheets

(56) References Cited

U.S. PATENT DOCUMENTS

| | | |
|---|---|---|
| 2016/0025932 A1 | 1/2016 | Shi et al. |
| 2016/0327746 A1 | 11/2016 | Mathai et al. |

FOREIGN PATENT DOCUMENTS

| | | |
|---|---|---|
| CN | 106464366 A | 2/2017 |
| CN | 107102405 A | 8/2017 |
| CN | 206725818 U | 12/2017 |
| CN | 108768516 A | 11/2018 |
| CN | 108873128 A | 11/2018 |

* cited by examiner

VCSEL-BASED FREE SPACE ACTIVE OPTICAL TRANSCEIVER COMPONENT

TECHNICAL FIELD

The present invention belongs to the field of optical communication, laser, or display devices, and in particular, to a vertical cavity surface emitting laser (VCSEL)-based free space active optical transceiver component.

BACKGROUND ART

In optical communication, transmitters and receivers of almost all optical transceivers are connected by optical fibers, including single-mode optical fibers, multi-mode optical fibers, plastic optical fibers, etc. Optical fiber connection has the advantages of low loss, small interference from an external environment, a transmission direction changeable at any time, etc., and it is very suitable for the connection of conventional optical communication. However, in the future short/medium-distance application scenarios, because of the disadvantages of easy breakage, complex wiring, affected appearance, etc. of optical fibers, a free space optical signal transmission scheme is being paid more and more attention to and adopted by people, and it is expected to replace optical fiber transmission in many short/medium-distance fields in the future, among which important application scenarios include high-definition very-large-screen 4K and 8K televisions, VR and AR multimedia devices, etc.

SUMMARY OF THE INVENTION

Aiming at the situation of the prior art, the present invention aims to provide a VCSEL-based free space active optical transceiver component, which is low in cost, small in size, h in transmission rate, and capable of implementing free space high-speed signal transmission in a medium/short-range high-definition multimedia interface (HDMI) device.

In order to achieve the above technical purpose, the technical scheme adopted by the present invention is as follows:

A VCSEL-based free space active optical transceiver component, which includes:
- a transmitter that includes a plurality of VCSELs, al least one photodiode, a first focusing lens army, and a first printed circuit board, the plurality of VCSELs and the photodiode being arranged in an array on the first printed circuit board, and the first focusing lens array being opposite to the plurality of VCSELs and the photodiode one by one and being configured to collimate transmitted signal light or focus received signal light; and
- a receiver that includes a plurality of photodiodes, at least one VCSEL, a second focusing lens array, and a second printed circuit board, the plurality of photodiodes and the VCSEL, being arranged in an array on the second printed circuit board, and the second focusing lens array being opposite to the plurality of photodiodes and the VCSEL one by one and being configured to focus received signal light or collimate transmitted signal light.

When signal light transmitted by the plurality of VCSELs of the transmitter is correspondingly emitted onto the first focusing lens array, the signal light is collimated into collimated signal light, and the collimated signal light is input to the second focusing lens array of the receiver and then correspondingly focused and input to the plurality of photodiodes corresponding to the receiver by the second focusing lens array. The VCSEL on the receiver is configured to transmit feedback signal light, and the feedback signal light is reversely input to the second focusing lens array, collimated, and transmitted to the first focusing lens array, and then is focused and input to the photodiode of the transmitter by the first focusing lens array.

Further, the plurality of VCSELs and the at least one photodiode of the transmitter are arranged on the first printed circuit board in parallel, and the plurality of photodiodes and the at least one VCSEL of the receiver are arranged on the second printed circuit board in parallel.

Further, the transmitter has 3-14 VCSELs and at least one photodiode, and the receiver has 3-14 photodiodes and at least one VCSEL.

Further, the first focusing lens array and the second focusing lens array have the same structure and respectively include a right-angle triangular prism and a plurality of first aspheric lenses, a right-angle surface of the right-angle triangular prism is an incident surface, the other right-angle surface of the right-angle triangular prism is an emergent surface, an inclined surface of the right-angle triangular prism is a reflecting surface, the plurality of aspheric lenses are arranged on one right-angle surface in parallel and configured to receive a collimated light signal transmitted by the transmitter or collimate light signals output by the VCSELs of the transmitter, and the other right-angle surface of the right-angle triangular prism is opposite to the plurality of VCSELs and the at least one photodiode on the transmitter or to the plurality of photodiodes and the at least one VCSEL on the receiver.

Preferably, the other right-angle surface of the right-angle triangular prism is provided with a plurality of second aspheric lenses corresponding to the plurality of VCSELs and the at least one photodiode on the transmitter or the plurality of photodiodes and the at least one VCSEL on the receiver.

As an implementation, the component further includes a first Z-block prism and a second Z-block prism. The first Z-block prism has a plurality of incident surfaces and an emergent end, and the plurality of incident surfaces are respectively provided with WDM filters with different working wavelengths. The WDM filters are respectively opposite to the first focusing lens array and correspond to the plurality of VCSELs and the photodiode on the transmitter one by one, for receiving signal light emitted by the different VCSELs and inputting the signal light into the first Z-block prism. Then the signal light is emitted to the receiver via the emergent end. An anti-reflection film is arranged in a corresponding area of an end face where the emergent end of the first Z-block prism is located, and a high-reflection film is arranged in the remaining area. One incident surface of the first Z-block prism corresponds to the photodiode of the transmitter, and after feedback signal light is received from the receiver, the feedback signal light reversely penetrates through the incident surface and is emitted to the corresponding first focusing lens array. The second Z-block prism has a plurality of emergent surfaces and an incident end, and the plurality of emergent surfaces of the second Z-block prism are also provided with WDM filters with different working wavelengths. The WDM filters are respectively opposite to the second focusing lens array and correspond to the plurality of photodiodes and the VCSEL on the receiver one by one. The incident end of the second Z-block prism is configured to receive signal light emitted by the first Z-block prism and correspondingly emit the signal light into the second focusing lens array from the plurality of emergent surfaces thereof. An anti-reflection film is arranged in a corresponding area of an end face where the incident end of the second Z-block prism is located, and a high-reflection film is arranged in the remaining area. One emergent surface of the second Z-block prism corresponds to the VCSEL of the receiver and is configured to receive feedback signal light emitted by the VCSEL, and the feedback signal light reversely penetrates through the emergent surface and then is reversely output from the incident end of the second Z-block prism.

As another implementation, the component further includes a band-pass filter array. The band-pass filter array is arranged at the receiver, the band-pass filter array is provided with filters with different working wavelengths, is opposite to the second focusing lens array, and divides signal light output by the transmitter into different wavelengths, the signal light is correspondingly emitted onto different photodiodes located at the receiver via the second lens array, and the feedback signal light emitted by the VCSEL on the receiver reversely penetrates through the band-pass filter array and is transmitted to the photodiode on the transmitter.

Another implementation scheme of the inventive concept may have the following structure:

a VCSEL-based free space active optical transceiver component, which includes:

a transmitter that includes a plurality of VCSELs, at least one photodiode, a first optical system, and a first printed circuit board, the plurality of VCSELs and the photodiode being arranged in an array on the first printed circuit hoard, and an incident end of the first optical system being opposite to the plurality of VCSELs and the photodiode and being configured to collimate transmitted signal light or focus received signal light; and a receiver that includes a plurality of photodiodes, at least one VCSEL, a second optical system, and a second printed circuit board, the plurality of photodiodes and the VCSEL being arranged in an array on the second printed circuit board, an incident end of the second optical system being configured to receive a light signal transmitted from an emergent end of the first optical system, and an emergent end of the second optical system being opposite to the plurality of photodiodes and the VCSEL and being configured to focus received signal light or collimate transmitted signal light.

When signal light emitted by the plurality of VCSELs of the transmitter enters the first optical system from the incident end of the first optical system and is collimated into collimated signal light, the collimated signal light is refracted via the emergent end of the first optical system and input to the incident end of the second optical system and enters the second optical system, the collimated signal light is correspondingly focused and input to the plurality of photodiodes corresponding to the receiver by the emergent end of the second optical system, the VCSEL on the receiver is configured to transmit feedback signal light, and the feedback signal light is reversely input into the second optical system and collimated, then refracted by the emergent end of the second optical system and reversely input into the first optical system, and then focused and input to the photodiode of the transmitter by the first optical system.

Further, the first optical system and the second optical system have the same structure and respectively include a right-angle triangular prism and a collimating lens, one end face of the collimating lens is a plane portion and is attached to a right-angle surface of the right-angle triangular prism, the other end face of the collimating lens is an arc-shaped surface, an inclined surface of the right-angle triangular prism is a reflecting surface, and the other right-angle surface of the right-angle triangular prism is opposite to the plurality of VCSELs and the at least one photodiode on the transmitter or to the plurality of photodiodes and the at least one VCSEL on the receiver.

Further, the receiver further includes a spacer that is arranged between the second printed circuit board and the second optical system, the spacer is provided with a light transmission hole array, and through holes in the light transmission hole array correspond to the plurality of photodiodes and the at least one VCSEL on the receiver one by one.

By adopting the above technical scheme, compared with the prior art, the present invention has the beneficial effects as follows: with the VCSEL-based free space active optical transceiver component proposed in present invention, the transmission and reception of a short/medium-distance free space (wireless) high-speed optical communication signal can be implemented, and a single-channel transceiving rate may reach 10 Gbps or higher. The component may be used for implementing a free space high-speed signal transmission function in a short/medium-range HDMI device. In addition, the present invention also has the characteristics of free space connection, high transmission rate, low cost, small size, easy assembly and mass production, etc., and has a broad market prospect.

BRIEF DESCRIPTION OF THE DRAWINGS

The present invention will be further described below with reference to the accompanying drawings and the Detailed Description.

DETAILED DESCRIPTION

Embodiment 1

Figure 1:
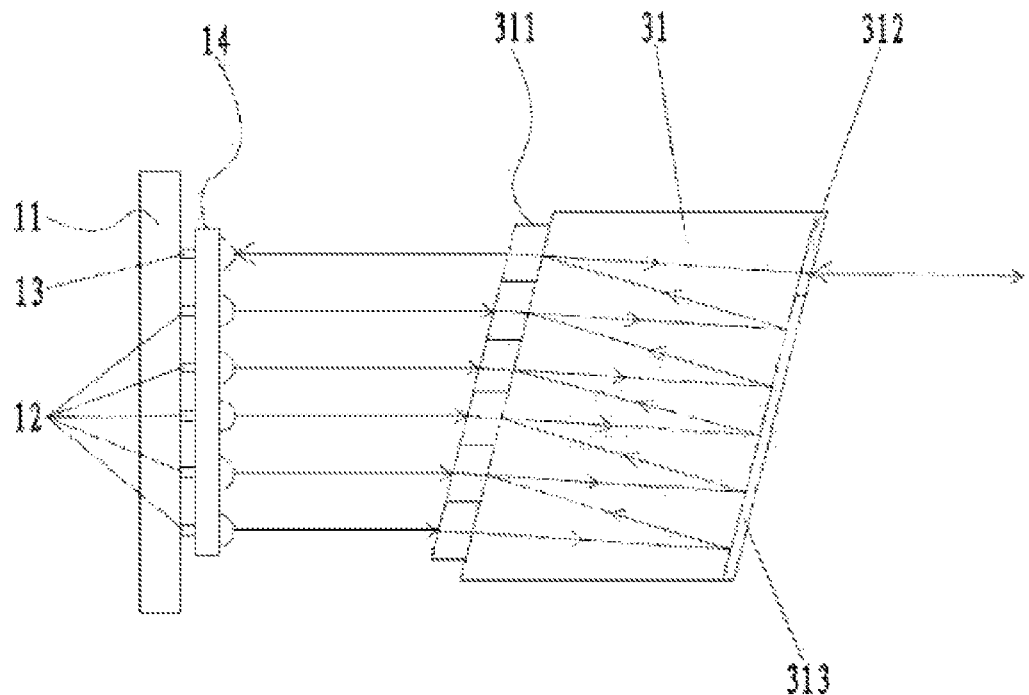
FIG. 1 is a schematic diagram showing a brief implementation structure of a transmitter according to Embodiment 1 of the present invention.
Figure 2:
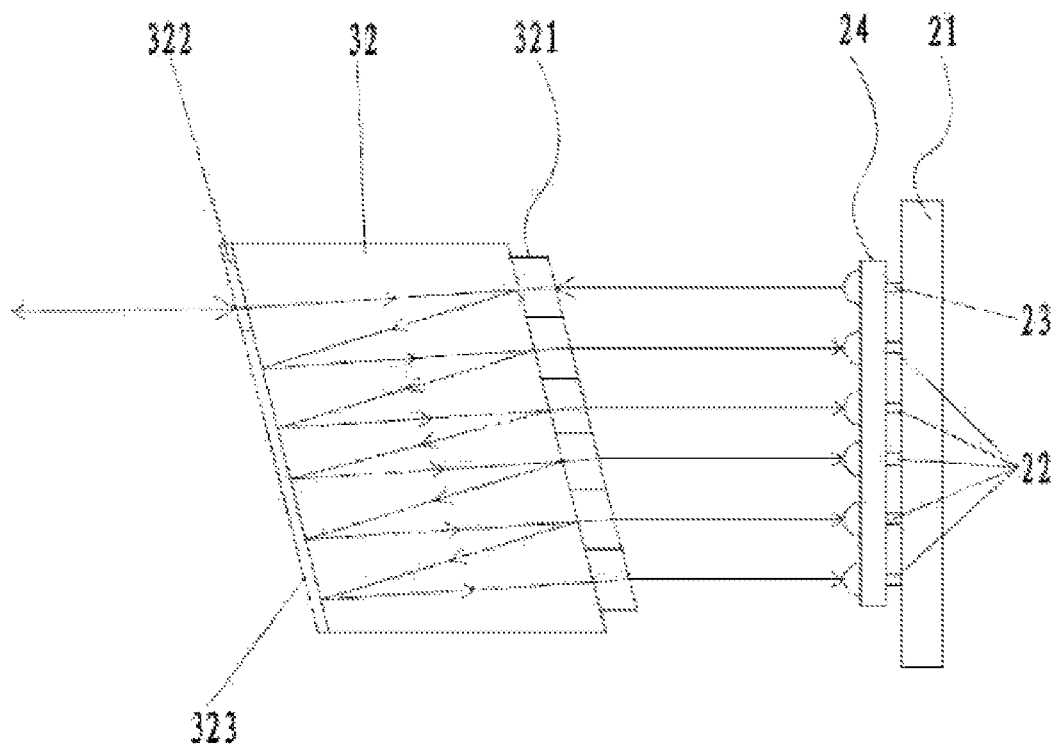
FIG. 2 is a schematic diagram showing a brief implementation structure of a receiver according to Embodiment 1 of the present invention.

As shown in one of FIG. 1 and FIG. 2, a VCSEL-based free space active optical transceiver component of the present embodiment includes:

a transmitter that includes a plurality of VCSELs 12, at least one photodiode 13, a first focusing lens array 14, and a first printed circuit board 11, the plurality of VCSELs 12 and the photodiode 13 being arranged in an array on the first printed circuit board 11, and the first focusing lens array 14 being opposite to the plurality of VCSELs 12 and the photodiode 13 one by one and being configured to collimate transmitted signal light or focus received signal light; and a receiver that includes a plurality of photodiodes 22, at least one VCSEL 23, a second focusing lens array 24, and a second printed circuit board 21, the plurality of photodiodes 22 and the VCSEL 23 being arranged in an array on the second printed circuit board 21, and the second focusing lens array 24 being opposite to the plurality of photodiodes 22 and the VCSEL 23 one by one and being configured to focus received signal light or collimate transmitted signal light.

When signal light transmitted by the plurality of VCSELs 12 of the transmitter is correspondingly emitted onto the first focusing lens array 14, the signal light is collimated into collimated signal light, and the collimated signal light is input to the second focusing lens array 24 of the receiver and then correspondingly focused and input to the plurality of photodiodes 22 corresponding to the receiver by the second focusing lens array 24. The VCSEL 23 on the receiver is configured to transmit feedback signal light, and the feedback signal light is reversely input tip the second focusing lens array 24, collimated, and transmitted to the first focusing lens array 14, and then is focused and input to the photodiode 13 of the transmitter by the first focusing lens array 14.

The structure of the present embodiment further includes a first Z-block prism 31 and a second Z-block prism 32. The first Z-block prism 31 has a plurality of incident surfaces and an emergent end, and the plurality of incident surfaces are respectively provided with WDM filters 311 with different working wavelengths. The WDM filters are respectively opposite to the first focusing lens array 14 and correspond to the plurality of VCSELs 12 and the photodiode 11 on the transmitter one by one, for receiving signal light emitted by the different VCSELs 12 and inputting the signal light into the first Z-block prism 31. Then the signal light is emitted to the receiver via the emergent end. An anti-reflection film 312 is arranged in a corresponding area of an end face where the emergent end of the first Z-block prism 31 is located, and a high-reflection film 313 is arranged in the remaining area. One incident surface of the first Z-block prism 31 corresponds to the photodiode 13 of the transmitter, and after the first Z-block prism 31 receives feedback signal light from the receiver, the feedback signal light reversely penetrates through the incident surface, is emitted to the corresponding first focusing lens array 14, and is focused and input to the photodiode 13 of the transmitter by the first focusing lens array 14. The second Z-block prism 32 has a plurality of emergent surfaces and an incident end, and the plurality of emergent surfaces of the second Z-block prism 32 are also provided with WDM filters 321 with different working wavelengths. The WDM filters are respectively opposite to the second focusing lens array 24 and correspond to the plurality of photodiodes 22 and the VCSEL 23 on the receiver one by one. The incident end of the second Z-block prism 32 is configured to receive signal light emitted by the first Z-block prism 31 and correspondingly emit the signal light into the second focusing lens dray 24 from the plurality of emergent surfaces thereof, and the second focusing lens array 24 correspondingly inputs the signal light to the plurality of photodiodes 22 on the receiver. An anti-reflection film 322 is arranged in a corresponding area of an end face where the incident end of the second Z-block prism 32 is located, and a high-reflection film 323 is arranged in the remaining area. One emergent surface of the second Z-block prism 32 corresponds to the VCSEL 23 of the receiver and is configured to receive feedback signal light emitted by the VCSEL 23, and the feedback signal light reversely penetrates through the emergent surface and then is reversely output from the incident end of the second Z-block prism 32 and transmitted to the transmitter.

Preferably, both the first Z-BLOCK prism 14 corresponding to the transmitter and the second Z-BLOCK prism 24 corresponding to the receiver have a thickness of 0.5-20 mm, and are inclined at an angle of 6-45° with respect to the VCSEL 12 of the transmitter or the photodiode 22 (PD) of the receiver.

The first Z-BLOCK prism 31 and the second Z-BLOCK prism 32 are configured for a light combining (MUX) function of the transmitter and a light splitting (DEMUX) function of the receiver of an optical module.

Since the light emitted by the transmitter is collimated light which does not need to be transmitted through waveguides such as optical fibers, the collimated light enters the receiver after being transmitted in a free space for a short/medium distance, and free space interconnection of high-speed signals is further realized.

In addition, an output end and an input end may be packaged through a shell respectively, and the correspondingly arranged first Z-BLOCK prism 31 and second Z-BLOCK prism 32 are also packaged in the input end and the output end respectively.

Further, the plurality of VCSELs 12 and the at least one photodiode 13 of the transmitter are arranged on the first printed circuit board 11 in parallel, d the plurality of photodiodes 22 and the at least one VCSEL 23 of the receiver are arranged on the second printed circuit board 21 in parallel. The first printed circuit board 11 and the second printed circuit board 21 are correspondingly integrated with driving circuits for driving VCSELs and photodiodes, receiver integrated circuits, and microcontrollers. The VCSELs and the photodiodes are assembled on the first printed circuit board 11 and the second printed circuit board 21 in the form of patches. Since the integration of driving circuits, receiver integrated circuits, and microcontrollers on the first printed circuit board 11 and the second printed circuit board 21 is the existing common technology, a detailed description thereof will be omitted.

Further, the transmitter has 3-14 VCSELs 12 and at least one photodiode 11, the plurality of VCSELs 12 and 23 are configured to generate light signals with different wavelengths, the wavelength range is 600-1400 nm, and a wavelength channel interval is 20-100 nm. Here, the plurality of VCSELs 12 and 23 typically have working wavelengths of 825 nm, 850 nm, 910 nm, 940 nm, 970 nm, and 1000 nm. The photodiodes (PD) 11 and 22 are configured to receive light signals transmitted by the VCSELs. The receiver has 3-14 light emitting diodes 22 and at least one VCSEL 23. Preferably, the arrangement spacing between adjacent VCSELs of the receiver or the transmitter or between adjacent PDs or between VCSELs and photodiodes is 0.25-5 mm.

Figure 3:
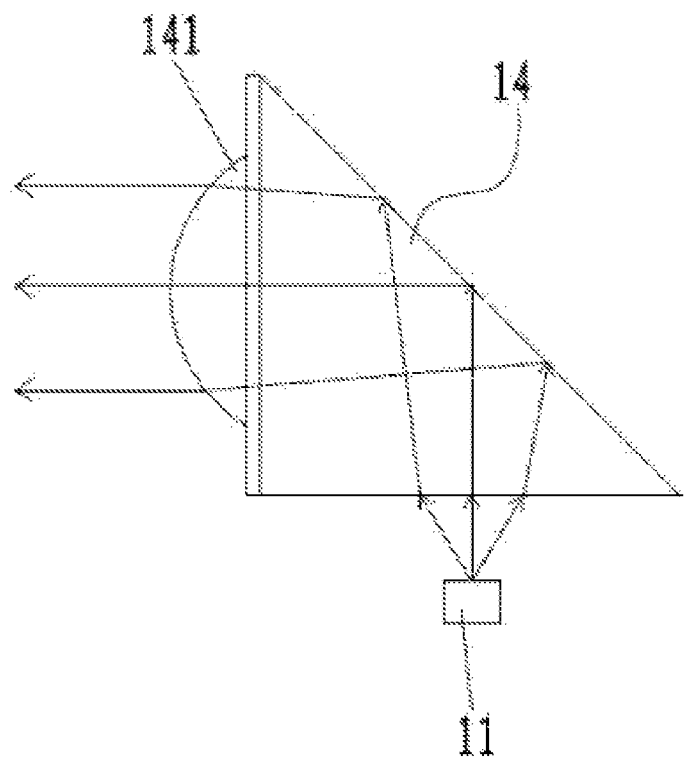
FIG. 3 is a schematic diagram showing a first brief implementation structure of a first focusing lens according to Embodiment 1 of the present invention.
Figure 4:
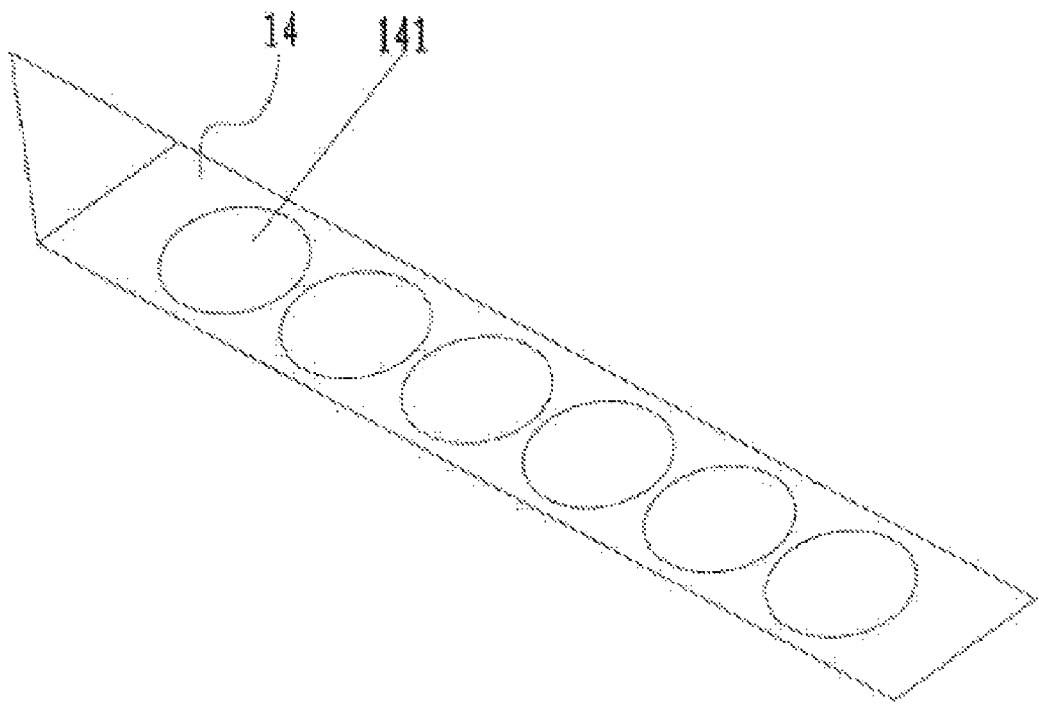
FIG. 4 is a schematic diagram showing a brief three-dimensional perspective implementation structure of the first focusing lens shown in FIG. 3.

As one implementation of a focusing lens array, further with reference to FIG. 3 and FIG. 4, in the present embodiment, the first focusing lens array 14 and the second focusing lens array 24 have the same structure. The first focusing lens array 14 include a right-angle triangular prism and a plurality of first aspheric lenses 141, a right-angle surface of the right-angle triangular prism is an incident surface, the other right-angle surface of the right-angle triangular prism is an emergent surface, an inclined surface of the right-angle triangular prism is a reflecting surface, the plurality of aspheric lenses 141 are arranged on one right-angle surface in parallel and configured to receive a collimated light signal transmitted by the transmitter or collimate light signals output by the VCSELs 12 of the transmitter, the other right-angle surface of the right-angle triangular prism is opposite to the plurality of VCSELs 12 and the at least one photodiode 11 on the transmitter, and the other right-angle surface of the right-angle triangular prism of the second focusing lens array 24 is opposite to the plurality of photodiodes 22 and the at least one VCSEL 23 on the receiver.

Figure 5:
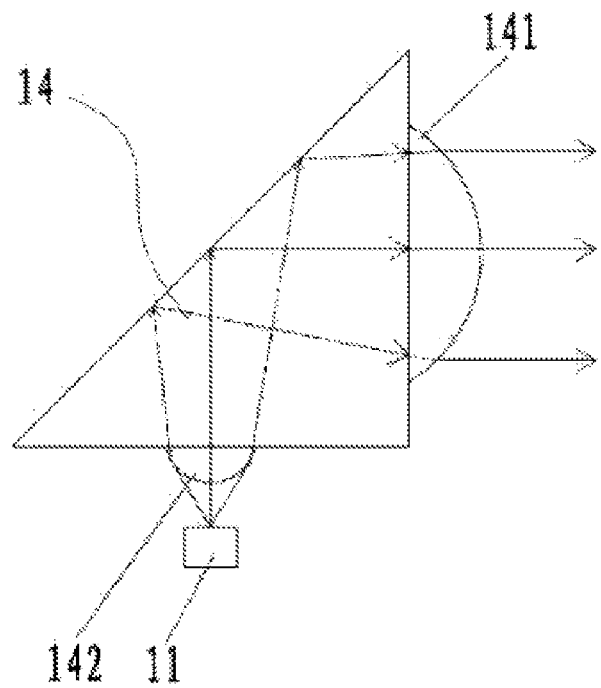
FIG. 5 is a schematic diagram showing a second brief implementation structure of a first focusing lens according to Embodiment 1 of the present invention.
Figure 6:
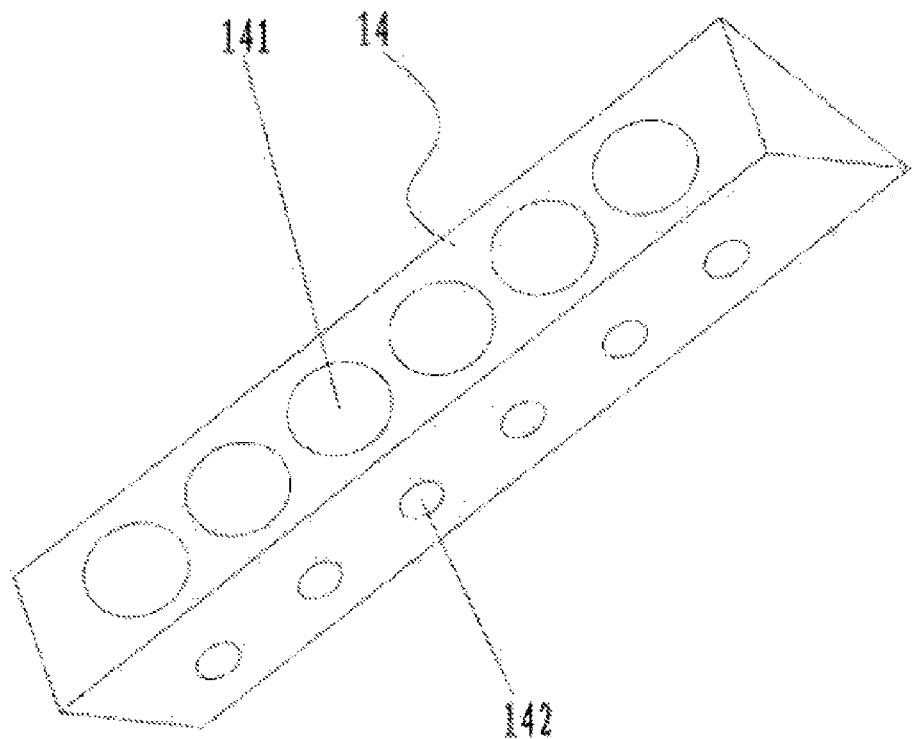
FIG. 6 is a schematic diagram showing a brief three-dimensional perspective implementation structure of the first focusing lens shown in FIG. 5.

As a further implementation of the focusing lens array shown in FIG. 3 and FIG. 4, with reference to FIG. 5 and FIG. 6, preferably, the other right-angle surface of the right-angle triangular prism of the first focusing lens array 14 is provided with a plurality of second aspheric lenses 142 corresponding to the plurality of VCSELs 12 and the at least one photodiode 11 on the transmitter, and the other right-angle surface of the right-angle triangular prism of the second focusing lens array is provided with a plurality of second aspheric lenses corresponding to the plurality of photodiodes 22 and the at least one VCSEL 23 on the receiver.

Although the foregoing discloses two implementation structures of the first focusing lens array 14 and the second focusing lens array 24, the present invention is not limited thereto. Preferably, the first focusing lens array 14 of the transmitter and the second focusing lens array 24 of the receiver may also be an array group each formed of spheric lenses or aspheric lenses.

Further preferably, the first focusing lens array 14 of the transmitter and the second focusing lens array 24 of the receiver are spheric lenses or aspheric lenses which are integrally formed through processing, injection molding, compression molding, or photoetching. The surface of the lens may be selectively plated with an optically anti-reflection film depending on the usage condition.

In the illustration of a transmitter of the present embodiment, an array of 5 VCSELs 12 with the same working wavelength of the transmitter is shown. An interval between every two VCSELs is 0.25 mm, and the laser light emitted (with a wavelength λ of ±10 nm) enters a collimating optical system formed by the first focusing lens array 14, the position of the VCSEL array from the collimating optical system being selected to be in a focal plane of the lens. At this moment, light emitting points of each VCSEL are symmetrically arranged on the focal plane of the lens, and beams emitted by the VCSELs under different fields of view will be collimated and emitted at different angles with a principal axis. In consideration of the fact that the angle of the maximum field of view cannot be too large, in practical designs, the interval between the VCSELs is considered to be as small as possible and the focal length of a collimating optical lens is considered to be as large as possible. A collimated beam (with a wavelength λ of ±10 nm) transmitted from the receiver is used as a feedback laser signal, which passes through a lens in the collimating optical system and is focused on the photodiode 13 (PD) placed on the focal plane of the lens, so that the feedback signal is collected and received.

In the illustration of a receiver of the present embodiment, a receiver including laser signals with 5 different wavelengths (wavelengths being λ2±10 nm, λ3±10 nm, +10 nm, λ5±10 nm, and λ26±10 nm, respectively) is shown. After the signal is emitted from the transmitter to the second Z-BLOCK prism 32 of the receiver, as described above, the function of the second Z-BLOCK prism 32 is exactly opposite to that of the first Z-BLOCK prism 31, and the function of wavelength demultiplexing (DEMUX) may be implemented here. After the first Z-BLOCK prism 31 receives signal light emitted by 5 VCSELs 12 of the transmitter, the signal light is folded back in the first Z-BLOCK prism 31 to form multi-wavelength composite light, which is then received by the incident end of the second Z-BLOCK prism 32, and finally is folded back in the second Z-BLOCK prism 32. A collimated beam composed of 5 wavelengths is demultiplexed into 5 collimated beams with different wavelengths, and after passing through the second focusing lens array 24, the collimated beams are focused on the corresponding 5 PDs to complete signal reception. Here, one VCSEL (with a wavelength λ1 of ±10 nm), as a feedback laser signal, is transmitted in a free space in a form of collimated light after passing through a collimating optical array (the second focusing lens array 24 here is reversed to be a collimating optical array) and a second Z-BLOCK prism 32, and finally received as a feedback signal by the transmitter.

In the present embodiment, by designing a glass or plastic transition piece between VCSELs/PDs, focusing lens arrays (collimating signal light input in one direction and focusing signal light input in another direction), and Z-BLOCK, real-time alignment or pre-alignment may be realized, and then they may be bonded and assembled on PCBs by using ultraviolet or thermosetting glue to respectively form a transmitter component and a receiver component. The assembly process can realize automation, low cost, and easy mass production.

Embodiment 2

Figure 7:
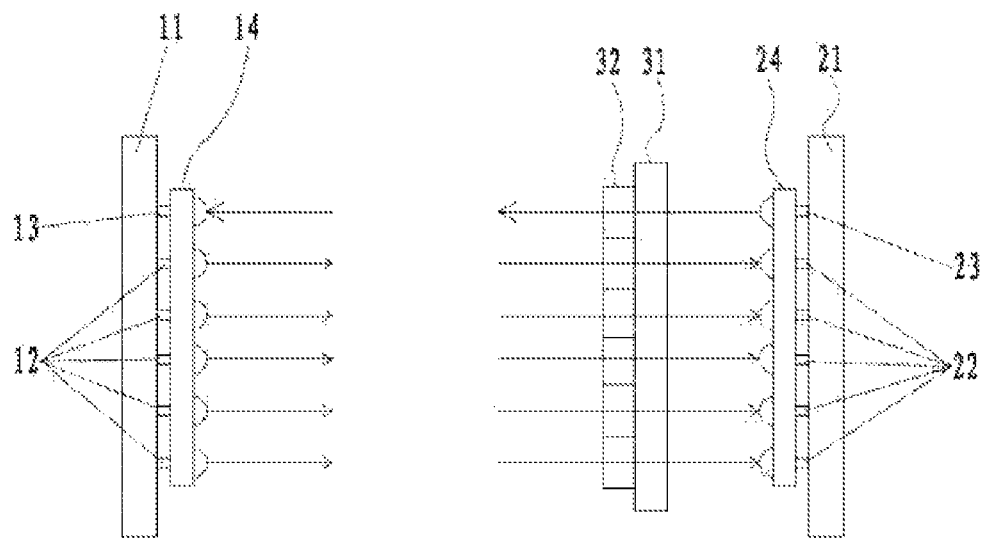
FIG. 7 is a schematic diagram showing a brief implementation structure of a transmitter and a receiver according to Embodiment 2 of the present invention.
Figure 8:
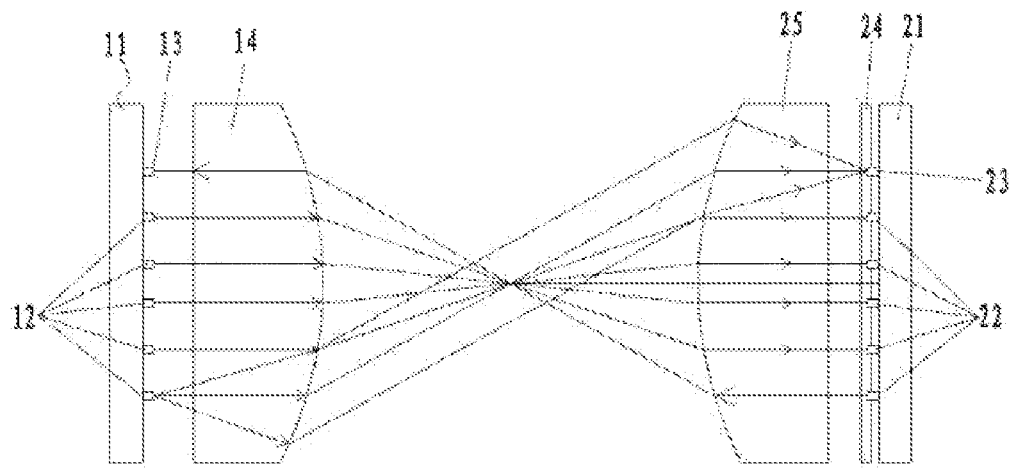
FIG. 8 is a schematic diagram showing a brief implementation structure of a transmitter and a receiver according to Embodiment 3 of the present invention.

With reference to FIG. 7, the present embodiment is substantially the same as Embodiment 1 except that the first Z-BLOCK prism and the second Z-BLOCK prism of Embodiment 1 are replaced by a band-pass filter array 31 in the present embodiment. The band-pass filter array 31 is arranged at the receiver, the band-pass filter array 31 is provided with filters 32 with different working wavelengths and is opposite to the second focusing lens array 24, the plurality of VCSELs 12 on the first printed circuit board 11 of the transmitter transmit signal light with different working wavelengths, the signal light is collimated by the first focusing lens array 14 and then input to the corresponding filter 32 of the corresponding band-pass filter array 31, and the filter 32 allows the signal light adapted to the working wavelength thereof to penetrate through (the band-pass filter can achieve the passage of a light signal with the required wavelength and the isolation of a non-required light signal). The signal light output by the transmitter is divided into different wavelengths through the band-pass filter array 31 and correspondingly emitted onto different photodiodes 22 on the second printed circuit board 21 of the receiver via the second lens array 24, and after the photodiode 22 receives the signal light of the transmitter, the VCSEL 23 on the receiver emits feedback signal light that reversely passes through the band-pass filter array 31 and then is transmitted to the photodiode 13 on the transmitter. When the signal-to-noise ratio requirement is not high, the band-pass filter array 31 of the present embodiment can be omitted, namely, the receiver is directly opposite to the transmitter, and signal light with different wavelengths emitted by the plurality of VCSELs 12 on the transmitter is directly input to the plurality of photodiodes 12 corresponding to the receiver.

When the plurality of VCSELs 12 of the transmitter are configured to generate a plurality of light signals with the same wavelength and the wavelength range is 600-1400 nm, the receiver does not require a band-pass filter array.

Since the light emitted by the transmitter is collimated light which does not need to be transmitted through waveguides such as optical fibers, after being transmitted in a free space for a short/medium distance, the light may enter the receiver with low loss due to small changes in size and morphology of light spots, thereby realizing free space interconnection of high-speed signals.

Preferably, the arrangement interval between adjacent VCSELs or between adjacent PDs of the receiver or the transmitter or between VCSELs and photodiodes is 0.5-5 mm. In addition, the arrangement form of VCSELs and photodiodes (PDs) of the receiver and the transmitter is not limited to the form of a single row or a single column shown in the present embodiment, but may also be in the form of an N×M matrix array with multiple rows and multiple columns. Also, the arrangement form of the filters 32 of the band-pass filter array 31 corresponds thereto.

Preferably, the band-pass filters 32 of the receiver each have a thickness of 0.2-3 mm, and a substrate material thereof may be optical glass, crystal, Si, or plastic, one side of which is plated with an optical band-pass filter film and the other side of which is plated with an anti-reflection film.

Further preferably, the band-pass filter 32 of the receiver may be bonded on a long glass substrate by glue, the refractive index of the glue is selected to be matched with that of the glass substrate, and a non-bonded surface of the glass substrate may be plated with an anti-reflection film to reduce insertion loss.

The specific working process of the structure of the present embodiment is as follows: a collimated beam emitted from the transmitter includes laser light with 5 different wavelengths (the wavelengths are λ2±10 nm, λ3±10 nm, λ4±10 nm, λ5±10 nm, and λ6±10 nm, respectively) and is emitted onto the band-pass filter array 31 from the transmitter direction. The band-pass filter may allow a light signal with a required channel wavelength to pass through, and light signals with other wavelengths will be isolated, then the functions of reducing crosstalk of adjacent channels and total crosstalk are realized, and the signal-to-noise ratio of received signals is improved. Collimated light passing through the band-pass filter array 31 is emitted into the second focusing lens array 24, passes through the second focusing lens array 24, and is focused on the PD arranged on a focal plane of an optical focusing array (i.e., on the plurality of photodiodes 22 of the receiver). One VCSEL 23 of the receiver emits laser light with a wavelength λ1 of ±10 nm as a feedback laser signal, which is transmitted in a free space in the form of collimated light and after passing through a collimating optical array (the second focusing lens array 24 here is reversed to be a collimating optical array) and the band-pass filter array 31, is finally received as a feedback signal by the transmitter.

Embodiment 3

The present embodiment is another implementation scheme of the inventive concept, and with reference to one of FIG. 8 to FIG. 12, the component includes:

a transmitter that includes a plurality of VCSELs 12, at least one photodiode 13, a first optical system 14, and a first printed circuit board 11, the plurality of VCSELs 12 and the photodiode 13 being arranged in an array on the first printed circuit board 11, and an incident end of the first optical system 14 being opposite to the plurality of VCSELs 12 and the photodiode 13 and being configured to collimate or focus received signal light; and a receiver that includes a plurality of photodiodes 22, at least one VCSEL 23, a second optical system 25, and a second printed circuit hoard 21, the plurality of photodiodes 22 and the VCSEL 23 being arranged in an array on the second printed circuit board 21, an incident end of the second optical system 25 being configured to receive a light signal transmitted from an emergent end of the first optical system 14, and an emergent end of the second optical system 25 being opposite to the plurality of photodiodes 22 and the VCSEL 23 and being configured to collimate or focus received signal light.

Since the integration of driving circuits, receiver integrated circuits, and microcontrollers on the first printed circuit board 11 and the second printed circuit board 21 is the existing common technology, a detailed description thereof will be omitted.

When signal light emitted by the plurality of VCSELs 12 of the transmitter enters the first optical system 14 from the incident end of the first optical system 14 and is collimated into collimated signal light, the collimated signal light is refracted via an emergent end of the first optical system 14 and input to the incident end of the second optical system 25 and enters the second optical system 25, the collimated signal light is correspondingly focused and input to the plurality of photodiodes 22 corresponding to the receiver by the emergent end of the second optical system 25, the VCSEL 23 on the receiver is configured to transmit feedback signal light, and the feedback signal light is reversely input into the second optical system 25 and collimated, then refracted by the emergent end of the second optical system 25 and reversely input into the first optical system 14, and then focused and input to the photodiode 11 of the transmitter by the first optical system 14.

Figure 9:
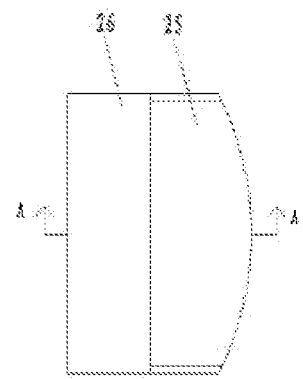
FIG. 9 is a schematic diagram showing a brief implementation structure first optical system according to Embodiment 3 of the present invention.
Figure 10:
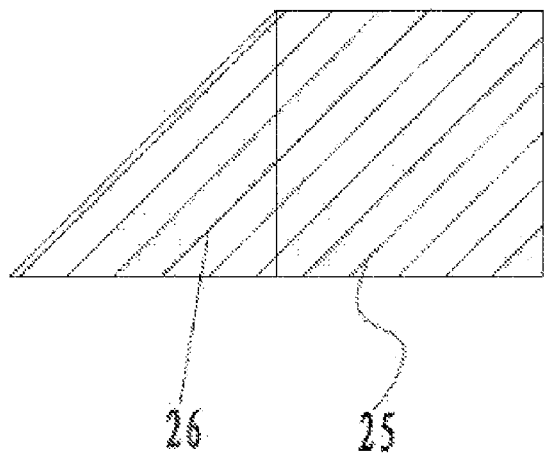
FIG. 10 is a schematic diagram showing a cross-section structure at A-A shown in FIG. 9.
Figure 11:
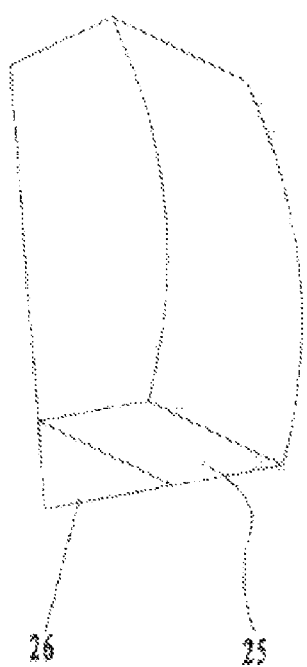
FIG. 11 is a schematic diagram showing a brief three-dimensional perspective implementation structure of the first optical system shown in FIG. 9.
Figure 12:
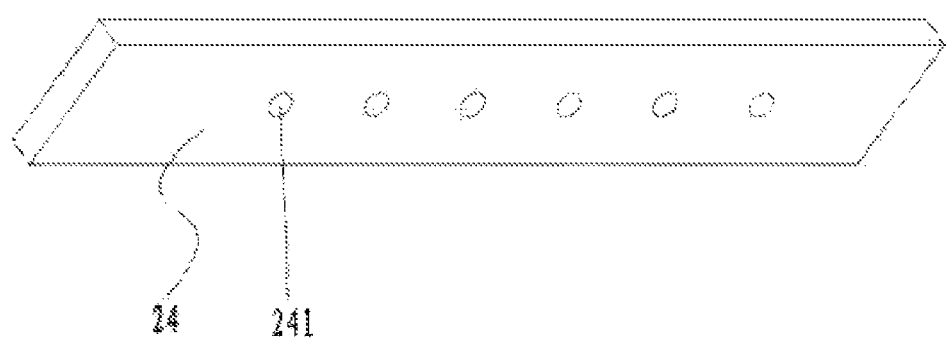
FIG. 12 is a schematic diagram showing a brief implementation structure of a spacer according to Embodiment 3 of the present invention.

The first optical system 14 and the second optical system 25 have the same structure and respectively include a right-angle triangular prism and a collimating lens. Referring particularly to FIG. 9 to FIG. 11, the structure of the second optical system 25 is shown. One end face of the collimating lens is a plane portion and is attached to a right-angle surface of the right-angle triangular prism 26, the other end face of the collimating lens is an arc-shaped surface, an inclined surface of the right-angle triangular prism 26 is a reflecting surface, and the other right-angle surface of the right-angle triangular prism 26 is opposite to the plurality of photodiodes 22 and the at least one VCSEL 23 on the receiver. The right-angle triangular prism of the first optical system 14 is opposite to the plurality of VCSELs 12 and the at least one photodiode 11 on the transmitter. The first optical system and the second optical system may focus collimated light with different fields of view to PDs (photodiodes) with different fields of view on a focal plane respectively, and meanwhile, diverging light emitted by VCSELs on the focal plane may be collimated reversely.

In addition, the receiver further includes a spacer 24. The spacer 24 is arranged between the second printed circuit board 21 and the second optical system 25, the spacer 24 is provided with a light transmission hole array 241, and through holes in the light transmission hole array 241 correspond to the plurality of photodiodes 22 and the at least one VCSEL 23 on the receiver one by one. The light transmission hole array 241 on the spacer 24 may block light signals of other fields of view and improve the signal-to-noise ratio of the light signals.

Preferably, the spacer 24 of the receiver has a thickness of 0.1-1 mm, and a substrate material thereof may be optical glass, crystal, or Si. When small holes in the light transmission hole array 241 are through holes, the substrate material is selected to be a material that is impermeable to light with the wavelength of the VCSEL, and the through holes may be made by machining or photoetching. The small hole array may also be patterned. At this moment, the substrate material is selected to be a material that is highly permeable to light with the wavelength of VCSEL, an anti-reflection film is plated in the small holes of the small hole pattern, an absorption film or a blocking film is plated outside the small holes, and the small hole pattern and the plated films may be made by a film plating method with a photomask. The small holes are 0.01-0.25 mm in diameter and the array interval is 0.25-0.5 mm.

In addition, the plurality of VCSELs 12 on the transmitter of the structure of the present embodiment are configured to generate a plurality of light signals with the same wavelength, the wavelength range is 600-1400 nm, and the plurality of photodiodes 22 (PDs) on the transmitter are configured to receive light signals transmitted by the VCSELs.

The first optical system of the transmitter and the second optical system of the receiver form optical conjugation, so that the transmitter and the receiver may transmit and receive light signals point-to-point one-to-one correspondence.

Since the light emitted by the transmitter is collimated light which does not need to be transmitted through waveguides such as optical fibers, after being transmitted in a free space for a short/medium distance, the light may enter the receiver with low loss due to small changes in size and morphology of light spots, thereby realizing free space interconnection of high-speed signals. In addition, the transmitter and the receiver may also be packaged through a shell respectively.

Preferably, the transmitter has 3-14 VCSELs and at least one PD, and the receiver has 3-14 PDs and at least one VCSEL.

Further preferably, the arrangement interval between adjacent VCSELs or between adjacent PDs of the receiver or the transmitter or between VCSELs and photodiodes is 0.25-0.5 mm.

The illustration of the present embodiment shows a 6-channel transmitter with 5 VCSELs 12 and 1 photodiode 13 (PD), and a 6-channel receiver with 5 photodiodes 22 and 1 VCSEL 23. In addition, the arrangement form of VCSELs and photodiodes (PDs) of the receiver and the transmitter is not limited to the form of a single row or a single column shown in the present embodiment, but may also be in the form of an N×M matrix array with multiple rows and multiple columns. Also, the arrangement form of small holes in the light transmission hole array 241 corresponds thereto.

The specific working process is as follows: the transmitter includes 5 VCSELs 12 with the same wavelength, which form an array. An interval between every two VCSELs 12 is 0.25 mm, and the laser light emitted (with a wavelength $\lambda$ of ±10 nm) enters the first optical system 14, the position of the VCSEL array from the first optical system 14 being selected to be in a focal plane of the lens. At this moment, light emitting points of each VCSEL 12 are symmetrically arranged on the focal plane of the lens, and beams emitted by the VCSELs 12 under different fields of view will be collimated and emitted at different angles with a principal axis. In consideration of the fact that the angle of the maximum field of view cannot be too large, in practical designs, the interval between the VCSELs should be considered to be as small as possible, and the focal length of a collimating optical lens should be considered to be as large as possible. A collimated beam (with a wavelength $\lambda$ of ±10 nm) transmitted from the receiver is used as a feedback laser signal, passes through a lens in a collimating optical system, and is focused on the PD placed on the focal plane of the lens, so that the feedback signal is collected and received.

The above are only examples of preferred implementations of the present invention. For those of ordinary skill in the art, according to the teachings of the present invention, equal changes, modifications, substitutions, and variations made in accordance with the scope of the patent application of the present invention without departing from the principle and spirit of the present invention should fall within the scope of the present invention.

The invention claimed is:

1. A vertical cavity surface emitting laser (VCSEL)-based free space active optical transceiver component, comprising:
a transmitter that comprises a plurality of first VCSELs, at least one first photodiode, a first focusing lens array, and a first printed circuit board, the plurality of first VCSELs and the first photodiode being arranged in an array on the first printed circuit board, the first focusing lens array being opposite to the plurality of first VCSELs and the at least one first photodiode one by one and being configured to collimate transmitted signal light or focus received signal light; and
a receiver that comprises a plurality of second photodiodes, at least one second VCSEL, a second focusing lens array, and a second printed circuit board, the plurality of second photodiodes and the at least one second VCSEL being arranged in an array on the second printed circuit board, the second focusing lens array being opposite to the plurality of second photodiodes and the at least one second VCSEL one by one and being configured to focus received signal light or collimate transmitted signal light,
wherein when signal light transmitted by the plurality of first VCSELs of the transmitter is correspondingly emitted onto the first focusing lens array, the signal light is collimated into collimated signal light, the collimated signal light is input to the second focusing lens array of the receiver and then correspondingly focused and input to the plurality of second photodiodes corresponding to the receiver by the second focusing lens array, the at least one second VCSEL on the receiver is configured to transmit feedback signal light, and the feedback signal light is reversely input to the second focusing lens array, collimated, and transmitted to the first focusing lens array, and then is focused and input to the at least one first photodiode of the transmitter by the first focusing lens array.

2. The VCSEL-based free space active optical transceiver component according to claim 1, further comprising a first Z-block prism and a second Z-block prism, wherein the first Z-block prism has a plurality of incident surfaces and an emergent end, the plurality of incident surfaces are respectively provided with first Wavelength Division Multiplexing (WDM) filters with different working wavelengths, the first WDM filters are respectively opposite to the first focusing lens array and correspond to the plurality of first VCSELs and the at least one first photodiode on the transmitter one by one, for receiving signal light emitted by the different ones of the first VCSELs and inputting the signal light into the first Z-block prism, then the signal light is emitted to the receiver via the emergent end, an anti-reflection film is arranged in a corresponding area of an end face where the emergent end of the first Z-block prism is located, a high-reflection film is arranged in the remaining area, one incident surface of the first Z-block prism corresponds to the first photodiode of the transmitter, and after the feedback signal light is received from the receiver, the feedback signal light reversely penetrates through the incident surface and is emitted to the corresponding first focusing lens array; and the second Z-block prism has a plurality of emergent surfaces and an incident end, the plurality of emergent surfaces of the second Z-block prism are also provided with second WDM filters with different working wavelengths, the second WDM filters are respectively opposite to the second focusing lens array and correspond to the plurality of second photodiodes and the at least one second VCSEL on the receiver one by one, the incident end of the second Z-block prism is configured to receive the signal light emitted by the first Z-block prism and correspondingly emit the signal light into the second focusing lens array from the plurality of emergent surfaces thereof; an anti-reflection film is arranged in a corresponding area of an end face where the incident end of the second Z-block prism is located, a high-reflection film is arranged in the remaining area, one emergent surface of the second Z-block prism corresponds to the at least one second VCSEL of the receiver and is configured to receive the feedback signal light emitted by the at least one second VCSEL, and the feedback signal light reversely penetrates through the emergent surface and then is reversely output from the incident end of the second Z-block prism.

3. The VCSEL-based free space active optical transceiver component according to claim 1, further comprising a band-pass filter array, wherein the band-pass filter array is arranged at the receiver, the band-pass filter array is provided with filters with different working wavelengths, is opposite to the second focusing lens array, and divides the signal light output by the transmitter into different wavelengths, the signal light is correspondingly emitted onto different ones of the second photodiodes located at the receiver via the second lens array, and the feedback signal light emitted by the at least one second VCSEL on the receiver reversely penetrates through the band-pass filter array and is transmitted to the at least one first photodiode on the transmitter.

4. The VCSEL-based free space active optical transceiver component according to claim 1, wherein the plurality of first VCSELs and the at least one first photodiode of the transmitter are arranged on the first printed circuit board in parallel, and the plurality of second photodiodes and the at least one second VCSEL of the receiver are arranged on the second printed circuit board in parallel.

5. The VCSEL-based free space active optical transceiver component according to claim 1, wherein the transmitter has between three and fourteen of the first VCSELs and the at least one first photodiode, and the receiver has between three and fourteen of the second photodiodes and the at least one second VCSEL.

6. The VCSEL-based free space active optical transceiver component according to claim 1, wherein the first focusing lens array and the second focusing lens array have a same structure and respectively comprise a right-angle triangular prism and a plurality of first aspheric lenses, a right-angle surface of the right-angle triangular prism is an incident surface, the other right-angle surface of the right-angle triangular prism is an emergent surface, an inclined surface of the right-angle triangular prism is a reflecting surface, the plurality of aspheric lenses are arranged on one right-angle surface in parallel and configured to receive a collimated light signal transmitted by the transmitter or collimate the light signals output by the at least one first VCSELs of the transmitter, and the other right-angle surface of the right-angle triangular prism is opposite to the plurality of first VCSELs and the at least one first photodiode on the transmitter or to the plurality of second photodiodes and the at least one second VCSEL on the receiver.

7. The VCSEL-based free space active optical transceiver component according to claim 6, wherein the other right-angle surface of the right-angle triangular prism is provided with a plurality of second aspheric lenses corresponding to the plurality of first VCSELs and the at least one first photodiode on the transmitter or the plurality of second photodiodes and the at least one second VCSEL on the receiver.

8. A VCSEL-based free space active optical transceiver component, comprising:
a transmitter that comprises a plurality of first VCSELs, at least one first photodiode, a first optical system, and a first printed circuit board, the plurality of first VCSELs and the at least one first photodiode being arranged in an array on the first printed circuit board, and an incident end of the first optical system being opposite to the plurality of first VCSELs and the at least one first photodiode and being configured to collimate transmitted signal light or focus received signal light; and
a receiver that comprises a plurality of second photodiodes, at least one second VCSEL, a second optical system, and a second printed circuit board, the plurality of second photodiodes and the at least one second VCSEL being arranged in an array on the second printed circuit board, an incident end of the second optical system being configured to receive a light signal transmitted from an emergent end of the first optical system, and an emergent end of the second optical system being opposite to the plurality of second photodiodes and the at least one second VCSEL and being configured to focus received signal light or collimate transmitted signal light,
wherein when signal light emitted by the plurality of first VCSELs of the transmitter enters the first optical system from the incident end of the first optical system and is collimated into collimated signal light, the collimated signal light is refracted via the emergent end of the first optical system and input to the incident end of the second optical system and enters the second optical system, the collimated signal light is correspondingly focused and input to the plurality of second photodiodes corresponding to the receiver by the emergent end of the second optical system, the at least one second VCSEL on the receiver is configured to transmit feedback signal light, and the feedback signal light is reversely input into the second optical system and collimated, then refracted by the emergent end of the second optical system and reversely input into the first optical system, and then focused and input to the at least one first photodiode of the transmitter by the first optical system.

9. The VCSEL-based free space active optical transceiver component according to claim 8, wherein the first optical system and the second optical system have a same structure and respectively comprise a right-angle triangular prism and a collimating lens, one end face of the collimating lens is a plane portion and is attached to a right-angle surface of the right-angle triangular prism, the other end face of the collimating lens is an arc-shaped surface, an inclined surface of the right-angle triangular prism is a reflecting surface, and the other right-angle surface of the right-angle triangular prism is opposite to the plurality of first VCSELs and the at least one first photodiode on the transmitter or to the plurality of second photodiodes and the at least one second VCSEL on the receiver.

10. The VCSEL-based free space active optical transceiver component according to claim 8, wherein the receiver further comprises a spacer that is arranged between the second printed circuit board and the second optical system, the spacer is provided with a light transmission hole array, and through-holes in the light transmission hole array correspond to the plurality of second photodiodes and the at least one second VCSEL on the receiver one by one.

11. An optical component for communication over free-space, the optical component comprising:
a transmitter having transmitter VCSELs and at least one transmitter photodiode arranged in a transmitter array, the transmitter VSELs and the at least one transmitter photodiode each having a transmitter lens portion associated therewith; and
a receiver opposing the transmitter over the free-space, the receiver having receiver photodiodes and at least one receiver VCSEL arranged in a receiver array, the at least one receiver VCSEL and the receiver photodiodes each having a receiver lens portion associated therewith;
wherein each of the transmitter VCSELs is configured to transmit signal light to the associated transmitter lens portion, each of the associated transmitter lens portions is configured to collimate the signal light into collimated signal light, and each of the receiver lens portions is configured to focus the collimated signal light to the associated receiver photodiode, and
wherein each of the at least one receiver VCSEL is configured to transmit feedback signal light to the associated receiver lens portion, each of the associated receiver lens portion is configured to collimate the feedback signal light, and each of the at least one associated transmitter lens portions is configured to focus the feedback signal light to the associated at least one transmitter photodiode.

12. The optical component of claim 11, wherein the transmitter lens portions comprise a plurality of transmitter lenses, and wherein the receiver collimation portions comprises a plurality of receiver lenses.

13. The optical component of claim 12, further comprising:
a transmitter Z-block prism disposed adjacent the transmitter and having an incident end and an emergent end, the incident end having transmitter (WDM) filters with different working wavelengths, each of the transmitter WDM filters disposed opposite to an associated one of the transmitter lenses and being configured to filter the signal light emitted by the associated one of the transmitter VCSELs into the transmitter Z-block prism, the transmitter Z-block being configured to emit the signal light to the receiver via the emergent end, at least one portion of the incident end of the transmitter Z-block prism corresponding to the at least one transmitter photodiode being configured to emit the feedback signal light received from the receiver to the at least one associated transmitter lens associated therewith; and
a receiver Z-block prism disposed adjacent the receiver and having an incident end and an emergent end, the emergent end having receiver (WDM) filters with different working wavelengths, the transmitter Z-block being configured to receive the signal light from the transmitter via the incident end, each of the receiver WDM filters disposed opposite to an associated one of the receiver lens and being configured to filter the signal light emitted from the receiver Z-block prism to the associated receiver photodiode, at least one portion of the emergent end of the receiver Z-block prism corresponding to the at least one receiver VCSEL being configured to pass the feedback signal light received from the receiver to the incident end.

14. The component of claim 12, further comprising a band-pass filter array disposed adjacent the receiver, the band-pass filter array having filters with different working wavelengths, each of the filters arranged opposite to an associated one of the receiver lenses, each of a plurality of the filters being configured to filter the signal light output by the transmitter into one of the different working wavelengths for the associated one of the receiver lenses of an associated one of the receiver photodiodes, at least one of the filters being configured to filter the feedback signal light output by the receiver into one of the different working wavelengths for the associated one of the transmitter lenses of an associated one of the at least one transmitter photodiodes.

15. The component of claim 11, comprising:
a transmitter optical system disposed adjacent the transmitter and having an incident end and an emergent end, the incident end of the transmitter optical system being opposite to the plurality of transmitter VCSELs and the at least one transmitter photodiode, the transmitter optical system providing the transmitter lens portions and being configured to collimate transmitted signal light or focus received signal light; and
a receiver optical system disposed adjacent the transmitter and having an incident end and an emergent end, the incident end of the receiver optical system being configured to receive signal light transmitted from the emergent end of the transmitter optical system, the emergent end of the receiver optical system being opposite to the receiver photodiodes and the at least one receiver VCSEL, the receiver optical system providing the receiver lens portions and being configured to focus received signal light or collimate transmitted signal light,
wherein the transmitter optical system is configured to collimate the signal light received at the incident end from the transmitter VCSELs and is configured to refract the collimated signal light from the emergent end,
wherein the receiver optical system is configured to receive the signal light at the incident end from the transmitter optical system and is configured to focus the signal light to the receiver photodiodes from the emergent end, wherein the receiver optical system is configured to collimate the feedback signal received at the emergent end from the at least one receiver VCSELs and is configured to refract the feedback signal light from the incident end, and wherein the transmitter optical system is configured to focus the feedback signal light received at the emergent end from the receiver optical system to the at least one transmitter photodiode from the incident end.

* * * * *